(12) United States Patent
Adachi et al.

(10) Patent No.: US 8,303,195 B2
(45) Date of Patent: Nov. 6, 2012

(54) OPTICAL TRANSCEIVER MODULE

(75) Inventors: Koichiro Adachi, Musashino (JP); Kazuhiko Hosomi, Fujisawa (JP); Toshiki Sugawara, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 237 days.

(21) Appl. No.: 12/810,442

(22) PCT Filed: Dec. 15, 2008

(86) PCT No.: PCT/JP2008/003766
§ 371 (c)(1),
(2), (4) Date: Jun. 24, 2010

(87) PCT Pub. No.: WO2009/081539
PCT Pub. Date: Jul. 2, 2009

(65) Prior Publication Data
US 2010/0278482 A1    Nov. 4, 2010

(30) Foreign Application Priority Data
Dec. 26, 2007    (JP) .................................. 2007-333988

(51) Int. Cl.
*G02B 6/36* (2006.01)
*G02B 6/38* (2006.01)

(52) U.S. Cl. ................. 385/93; 385/73; 385/74; 385/75

(58) Field of Classification Search .............. 385/73–75, 385/93
See application file for complete search history.

(56) References Cited

U.S. PATENT DOCUMENTS

| | | | | |
|---|---|---|---|---|
| 4,244,045 A * | 1/1981 | Nosu et al. ..................... 398/86 |
| 4,701,012 A * | 10/1987 | Kaiser ............................ 398/79 |
| 5,119,454 A * | 6/1992 | McMahon ..................... 385/49 |
| 5,835,517 A * | 11/1998 | Jayaraman et al. ....... 372/50.124 |
| 5,894,535 A * | 4/1999 | Lemoff et al. ................. 385/47 |
| 6,008,920 A * | 12/1999 | Hendrix ......................... 398/79 |
| 6,167,171 A * | 12/2000 | Grasis et al. .................. 385/24 |
| 6,198,864 B1 * | 3/2001 | Lemoff et al. ................. 385/47 |
| 6,201,908 B1 * | 3/2001 | Grann ............................ 385/24 |

(Continued)

FOREIGN PATENT DOCUMENTS
JP          9-15442  A        1/1997

(Continued)

OTHER PUBLICATIONS

Akira Ohki, et al., IEICE Technical Report, R2007-2, pp. 7-10. vol. 107, No. 7.

(Continued)

Primary Examiner — Rhonda Peace
(74) Attorney, Agent, or Firm — Crowell & Moring LLP

(57) ABSTRACT

The optical module includes an optical device mounting substrate 1 and an optical multiplexer/demultiplexer 2. One laser diode and at least one photodetector, which are positioned in the same plane, are mounted on the optical device mounting substrate 1. The optical multiplexer/demultiplexer is prepared by mounting a wavelength-selective filter and a mirror on the front and back surfaces of a transparent substrate. The optical device mounting substrate and the optical multiplexer/demultiplexer are mounted in a package 3 in such a manner that the optical device mounting surface and the filter surface are not parallel to each other. The optical module also includes a first lens, which is positioned near the laser diode or monolithically integrated with the laser diode, and a second lens, which converges light coming out of the optical multiplexer/demultiplexer toward an optical fiber.

18 Claims, 8 Drawing Sheets

U.S. PATENT DOCUMENTS

| | | | |
|---|---|---|---|
| 6,396,978 B1* | 5/2002 | Grann | 385/24 |
| 6,819,871 B1* | 11/2004 | Baldwin et al. | 398/85 |
| 6,941,047 B2* | 9/2005 | Capewell et al. | 385/47 |
| 6,945,711 B2* | 9/2005 | Chen et al. | 385/93 |
| 7,260,328 B2* | 8/2007 | Kropp | 398/82 |
| 7,840,100 B2* | 11/2010 | Goldenberg et al. | 385/11 |
| 2002/0018635 A1* | 2/2002 | Hsieh et al. | 385/137 |
| 2002/0081073 A1* | 6/2002 | Lee et al. | 385/47 |
| 2003/0058520 A1* | 3/2003 | Yu et al. | 359/291 |
| 2003/0152113 A1* | 8/2003 | Kropp | 370/535 |
| 2003/0190126 A1* | 10/2003 | Toyoshima et al. | 385/120 |
| 2004/0013366 A1* | 1/2004 | Morris et al. | 385/39 |
| 2004/0101247 A1* | 5/2004 | Chen et al. | 385/47 |
| 2004/0165828 A1* | 8/2004 | Capewell et al. | 385/47 |
| 2004/0208452 A1* | 10/2004 | Kropp | 385/47 |
| 2005/0089268 A1* | 4/2005 | Chen et al. | 385/24 |
| 2010/0278482 A1* | 11/2010 | Adachi et al. | 385/33 |

FOREIGN PATENT DOCUMENTS

| | | |
|---|---|---|
| JP | 2005-352065 A | 12/2005 |

OTHER PUBLICATIONS

International Search Report including English translation dated Feb. 3, 2009 Four (4) pages.

\* cited by examiner (A)

(B)

(C)

OPTICAL TRANSCEIVER MODULE

TECHNICAL FIELD

The present invention relates to an optical transceiver module, and more particularly, to a bi-directional optical transceiver module that multiplexes or demultiplexes light having multiple wavelengths.

BACKGROUND ART

In the field of information and communication, the communication traffic for exchanging a large amount of data at a high speed by using light has been improved rapidly in recent years. Particularly, the use of broadband access lines has been accelerated in accordance with the explosive growth of the Internet, and FTTH (Fiber To The Home) services have been significantly established in the market. Among optical transmission systems of FTTH, the PON (Passive Optical Network) system, which allows plural subscribers to share one optical fiber, is now enjoying an increasing demand. The PON system receives data transmitted from a central office through one optical fiber, branches the received data to 16 to 32 optical fibers by using a splitter, and distributes the data to each subscriber's home or office, thereby greatly reducing the cost of laying optical fibers.

An ONU (Optical Network Unit) is installed at a subscriber's home or office as a terminal device. The ONU subjects a downlink signal (having a wavelength of 1.5 µm), which is transmitted from the central office to the subscriber's home or office, and an uplink signal (having a wavelength of 1.3 µm), which is transmitted from the subscriber's home or office to the central office, to wavelength division multiplexing (WDM), and transfers the uplink and downlink signals with the same optical fiber. A dual-wavelength bi-directional optical module is mounted in the ONU. This optical module basically includes a laser diode (LD) for transmitting an uplink signal, a photodetector (PD) for receiving a downlink signal, and a WDM filter for separating uplink and downlink signals.

A conventional module system is shown in FIG. 9. This figure shows a basic configuration of a single-conductor bi-directional (BIDI) module. This module includes a laser diode 175, a photodetector 172, and a wavelength-selective filter 177. These optical parts are spatially arranged in a package 178. The use of this conventional module system makes it possible to manufacture the optical parts independently. Therefore, it is easy to achieve an adequate manufacturing yield. Further, an optical connection can be established by means of so-called active alignment, which is effected to achieve optical axis alignment with an optical fiber 170 while operating the optical devices 175 and 172 mounted in CAN packages 173, 176 in which lenses 171, 174 are respectively integrated. This provides an advantage of achieving stable optical coupling efficiency. At the same time, however, this also increases the number of parts and the number of processing man-hours, thereby making it difficult to achieve downsizing and cost reduction.

FIG. 10 shows a basic configuration of a second system of a single-conductor bi-directional module disclosed in Non-patent document 1 (IEICE Technical Report, Vol. 107, No. 7, R2007-2, pp. 7-10). The example shown in this figure indicates that downsizing is achieved by placing a laser diode 182, a photodetector 186, and a wavelength-selective filter 183 in a CAN package 187.

However, as is the case with the first example described earlier, it is necessary to arrange the laser diode 182, photodetector 186, and wavelength-selective filter 183 in a three-dimensional pattern. As downsizing is achieved, it is necessary to mount the above parts with increased accuracy. Further, the process of axis alignment becomes complicated. Moreover, when, for instance, a triple-wavelength bi-directional optical module is to be manufactured in consideration of extensibility, it is necessary to increase the number of optical parts and the mounting area at least twofold. This makes downsizing and cost reduction more difficult.

Non-patent document 1: IEICE Technical Report, Vol. 107, No. 7, R2007-2, pp. 7-10

DISCLOSURE OF THE INVENTION

Problems to be Solved by the Invention

As described above, the conventional technologies involve many optical parts mounting steps including those for optical devices. In addition, the tolerance of positional accuracy of a wavelength demultiplexer, or more particularly, the tolerance of angular displacement, is low. Therefore, highly accurate mounting is required so that it is difficult to achieve an adequate yield. Further, when extensibility is taken into consideration, the number of optical parts and the mounting area need to be increased approximately twofold, and downsizing and highly accurate mounting of optical parts are demanded. This makes it more difficult to achieve an adequate yield.

Accordingly, the present invention relates to an optical module that is used as a multiple-wavelength optical transmission or single-conductor bi-directional optical transmission terminal device for transmitting light having plural wavelengths with one optical fiber. An object of the present invention is to provide an optical module that is capable of significantly reducing the number of mounting steps, permitting downsizing, and achieving a high yield without sacrificing low-loss optical characteristics and high reliability.

Means of Solving the Problems

To address the above problems, according to an aspect of the present invention, there is provided an optical transceiver module including an optical device mounting substrate and an optical multiplexer/demultiplexer. One laser diode and at least one photodetector, which are positioned in the same plane, are mounted on the optical device mounting substrate. The optical multiplexer/demultiplexer is typically prepared by mounting a wavelength-selective filter and a mirror on the front and back surfaces of a transparent substrate. The optical device mounting substrate and the optical multiplexer/demultiplexer are mounted in a package in such a manner that the optical device mounting surface and the filter surface are not parallel to each other. Optical devices using different operating wavelengths are mounted on the optical device mounting substrate and positioned at desired locations thereof. The optical multiplexer/demultiplexer uses a support substrate that has a pair of parallel opposing surfaces and is made of a material transparent to optical wavelengths. One of the pair of parallel surfaces is provided with at least one type of a wavelength-selective filter, whereas the remaining surface is provided with a mirror that reflects light having wavelengths unselected by a first filter.

In the above instance, the filter and mirror are provided with a window for incoming light and outgoing light. The optical transceiver module also includes a first lens and a second lens. The first lens is positioned near the laser diode or monolithically integrated with the laser diode. The second lens converges the light coming out of the optical multiplexer/ demultiplexer toward an optical fiber. Further, the second lens has a larger diameter than the first lens.

An operation of the optical transceiver module according to an aspect of the present invention will now be described with reference to FIG. 2. FIG. 2 is a schematic diagram illustrating the functionality that is exercised when the present invention is applied to a module called an optical triplexer. The module functions so that light having a wavelength of $\lambda_1$, which is emitted from a laser diode 11, is connected to an optical fiber (not shown) installed outside the module, and that light having a wavelength of $\lambda_2$ and light having a wavelength of $\lambda_3$, which are emitted from the optical fiber, are respectively incident on predetermined photodetectors 12, 13. As an optical multiplexer/demultiplexer 2 is installed at an angle that is not perpendicular to the incoming light from the optical fiber and the optical axis of the laser diode 11, the light is obliquely incident on a wavelength-selective filter array and a mirror array. Consequently, the light having a particular wavelength is eliminated or added at the intersection between each filter and optical axis.

As shown in FIG. 2, the optical axes for individual for wavelengths are determined by the thickness d and angle $\theta_1$ of a glass substrate, and arranged on a straight line in the horizontal plane. Therefore, when various devices are disposed on the optical axes, which are uniquely determined during a design stage, the optical devices can be coupled with the optical fiber. The light having a wavelength of $\lambda_1$, which is emitted from the laser diode 11, is turned into a non-diffuse optical beam by a lens 1001, which is positioned near the laser diode 11 or monolithically integrated with the laser diode 11. The resultant optical beam is then transmitted through the optical multiplexer/demultiplexer 2, focused by a lens 4, and incident on an optical fiber (not shown). In this instance, the lens 4 has a larger diameter than the lens 1001. Further, the lens 4 converges the light emitted from the optical fiber (not shown) toward either the photodetector 12 or the photodetector 13. In this instance, the distance from the lens 4 to the laser diode 11 and the lens 1001 is shorter than the distance from the lens 4 to the photodetector 12 or the photodetector 13, as shown in FIG. 2. In other words, the optical system according to an aspect of the present invention is configured so that the distance from the lens 4 to the laser diode 11 and the lens 1001 is shorter than the distance from the lens 4 to a point at which the light emitted from the optical fiber is converged by the lens 4.

A first feature of the present invention is that plural filters are automatically aligned simply when glass substrate alignment is effected once. This greatly reduces the number of mounting steps. A second feature is that the laser diode and photodetectors are mounted on an optical device mounting substrate in a planar arrangement. This significantly simplifies the process of mounting and provides highly accurate mounting as compared with a case where a three-dimensional mounting scheme is employed. Further, alignment is achieved simply by effecting optical device mounting substrate alignment. This makes the number of processes smaller than when various devices are individually aligned.

When the angle of the substrate is $\theta_1$, the angle of incidence (incidence angle) of the light emitted from the optical fiber or the laser diode 11 with respect to the perpendicular direction of the substrate surface is $\theta_1$. According to the Snell's law, the angle $\theta_2$, which prevails in a substrate material after refraction, is equal to $\sin^{-1}(n_1 \times \sin \theta_1/n_2)$ when the refractive index of the outside is $n_1$ and the refractive index of the substrate is $n_2$.

In the above instance, the cycle y of multiple reflection in the substrate is 2d tan $\theta_2$ when the thickness of the transparent substrate is d. When the multiple-reflected light is wavelength-separated by a filter on the earlier-described principle and emitted to a plane perpendicular to the optical axis for incidence, its cycle z is 2d tan $\theta_2 \times \cos \theta_1$. As the cycle z corresponds to the intervals between devices mounted on the device mounting substrate, the values d and $\theta_1$ need to be determined so as to provide appropriate device intervals. The value z needs to be 100 µm or greater because the devices are not smaller than 100 µm in size. A third feature is that the lens 4 has a larger diameter than the lens 1001. This makes it possible to greatly increase the tolerance on the position gap of the laser diode 11.

Effects of the Invention

Embodiments of the present invention relate to an optical transmitter module that multiplexes light having plural wavelengths and transmits the multiplexed light, an optical receiver module that demultiplexes multiplexed light into individual wavelengths and receives the demultiplexed light, or a single-conductor bi-directional optical transceiver module. The embodiments provide an optical module that is capable of significantly reducing the number of optical parts and the number of mounting steps, permitting downsizing, and achieving a high yield without sacrificing low-loss optical characteristics and high reliability. The embodiments also provide a method for manufacturing such an optical module.

BEST MODE FOR CARRYING OUT THE INVENTION

The embodiments of the present invention will now be described with reference to the accompanying drawings.

First Embodiment

FIG. 1 are cross-sectional views of an optical module according to a first embodiment of the present invention. The present invention shown in FIG. 1 is applied to a so-called optical triplexer module, which is a bi-directional optical transceiver module using three wavelengths.

FIG. 1 show an example in which the module is mounted in a CAN package. An optical device mounting substrate 1 is mounted on a CAN stem 14. The optical device mounting substrate 1 includes a sub-mount 10 on which a laser diode 11 and photodetectors 12, 13 are mounted. An optical multiplexer/demultiplexer 2 is mounted on a CAN cap 3. A lens 1001 is positioned near the laser diode 11 or monolithically integrated with the laser diode 11. Operating wavelengths used by the laser diode 11 and the photodetectors 12, 13 are $\lambda_1$, $\lambda_2$, and $\lambda_3$, respectively. The relationship between their lengths is given by the expression $\lambda_1 < \lambda_2 < \lambda_3$. From left to right in FIG. 1, the laser diode and photodetectors are arranged in the order of increasing operating wavelength. However, the laser diode and photodetectors may alternatively be arranged in the order of decreasing operating wavelength in FIG. 1.

The interior of the CAN cap 3 is provided with surface irregularities so that the optical multiplexer/demultiplexer can be mounted on the CAN cap 3. The optical multiplexer/demultiplexer 2 uses a transparent glass substrate 5 as a support substrate. A first wavelength-selective filter 6 and a second wavelength-selective filter 7, which are positioned adjacent to each other, are mounted on one surface of the transparent glass substrate 5. A first mirror 8 and a second mirror 9 are mounted on the opposing surface that is parallel to the surface on which the wavelength-selective filters 6, 7 are mounted. The transparent glass substrate may be made of amorphous glass, sapphire crystal, crystal quartz, or silicon.

When the optical multiplexer/demultiplexer is to be mounted on the CAN cap, it is externally fit on the surface irregularities of the CAN cap and glued to its position with UV-curable resin. The glass substrate is made of BK7 and 1136 μm in thickness. The glass substrate is mounted in such a manner that its angle relative to the plane is 20°. The value z in FIG. 2, that is, the projection of multiple reflection pitch onto the plane, is 500 μm. The wavelength-selective filters are formed by a dielectric multilayer or a diffraction grating. In the present embodiment, dielectric multilayers made of $Ta_2O_5$ and $SiO_2$ are used for the wavelength-selective filters.

The first wavelength-selective filter 6 has a separation wavelength $\lambda_{th}$ that is given by the expression $\lambda_1 < \lambda_{th} < \lambda_2$. More specifically, the first wavelength-selective filter 6 is a so-called short-pass filter that allows light having a wavelength shorter than $\lambda_{th}$ to pass through and reflects light having a wavelength longer than $\lambda_{th}$. The second wavelength-selective filter 7 is a short-pass filter having a separation wavelength $\lambda_{th}$ that is given by the expression $\lambda_2 < \lambda_{th} < \lambda_3$. An alternative is to use a first wavelength-selective filter 6 having a separation wavelength $\lambda_{th}$ that is given by the expression $\lambda_2 < \lambda_{th} < \lambda_3$ and allows light having a wavelength longer than $\lambda_{th}$ to pass through and reflects light having a wavelength shorter than $\lambda_{th}$, and use a second wavelength-selective filter 7 that is a short-pass filter having a separation wavelength $\lambda_{th}$ that is given by the expression $\lambda_1 < \lambda_{th} < \lambda_2$.

The first mirror 8 is identical with the first wavelength-selective filter 6, whereas the second mirror 9 is identical with the second wavelength-selective filter 7. A vertical emitting LD in which a microlens is integrated is used as the laser diode 11 on the optical device mounting substrate. Although an edge emitting LD may be used as the laser diode 11, it is preferred that a vertical-emitting type be used to provide ease of mounting. It is also preferred that a lens-integrated type be used to provide ease of optical coupling and reduce the number of parts. For the same reason, it is preferred that the photodetectors 12, 13 be of a surface-incident type. An amplifier and a capacitor are also mounted in the CAN package. However, they are not shown in the figure because they are the same as those used in a conventional case.

The material for the transparent substrate 5 is not limited, and is acceptable as far as it is transparent to the operating wavelength. However, it is preferred that an inexpensive material exhibiting high processing accuracy be used. In that sense, BK7 is used in the present embodiment. It is obvious, however, that other glass materials, a dielectric material, or a semiconductor material may be used as well.

An operation performed in the above-described configuration will now be described. Light having a wavelength of $\lambda_1$ is emitted from the laser diode 11 and delivered to the first wavelength-selective filter 6. The first wavelength-selective filter 6 allows the light having a wavelength of $\lambda_1$ to pass through. The light is then refracted by the transparent substrate. The refracted light travels in parallel rays along an optical path and optically connects to an external optical fiber through the package lens 4. Meanwhile, light obtained by multiplexing light having wavelengths of $\lambda_2$ and $\lambda_3$, which is emitted from the optical fiber, is incident on the transparent glass substrate, then refracted, and delivered to the first wavelength-selective filter 6. The light having wavelengths of $\lambda_2$ and $\lambda_3$ is then reflected and delivered to the opposing first mirror 8. As the first mirror 8 is identical with the first wavelength-selective filter 6, the light having wavelengths of $\lambda_2$ and $\lambda_3$ is reflected again. The mirror 8 is identical with the filter 6 in order to provide an enhanced capability of blocking a wavelength of $\lambda_1$. The light having a wavelength of $\lambda_1$, which is emitted from the laser diode 11, is slightly reflected from the surface of the lens 4, the end face of the optical fiber, and some other places. The reflected light then serves as return light and becomes incident again. When the return light having a wavelength of $\lambda_1$ is incident on the photodetectors 12, 13, it becomes noise even if its amount is small. Although the return light having a wavelength of $\lambda_1$ passes through the filter 6, a small amount of it is reflected. Therefore, the light is allowed to pass through the mirror 8 again to further reduce its amount.

For the reason described above, the present embodiment uses the mirror 8 that is identical with the filter 6. However, when the specifications for wavelength separation are not stringent, satisfactory results can be obtained by using a normal mirror that is not wavelength-dependent.

The light reflected from the mirror 8 is incident on the filter surface again. In the simplest design, the light reflected from the mirror 8 is incident on a second filter. In the configuration according to the present embodiment, however, the light reflected from the mirror 8 is incident on the filter 6 again so as to reciprocate once again between the filter 6 and the mirror 8. This configuration is employed to ensure that the interval between the laser diode 11 and the photodetector 12 is larger than the projection of multiple reflection pitch. The reason is that the laser diode, which is driven at a high speed, may become a noise source for the photodetectors (so that electrical crosstalk occurs). If electrical crosstalk and other interferences are not anticipated, it is preferred that the multiple reflection pitch in the glass substrate coincide with the mounting pitch of devices to minimize the number of reflections.

The light that has reciprocated two times between the filter 6 and the mirror 8 becomes incident on the second wavelength-selective filter 7. The light is then separated into light having a wavelength of $\lambda_2$ and light having a wavelength of $\lambda_3$. The light having a wavelength of $\lambda_2$ is allowed to pass through the filter, refracted, and vertically incident on the photodetector 12. Meanwhile, the light having a wavelength of $\lambda_3$ is reflected and then incident on the mirror 9. For the same reason as for the mirror 8, the mirror 9 uses the same dielectric multilayer filter as the filter 7. The light reflected from the mirror 9 passes through an AR-coated interfacial surface without a filter and becomes incident on the photodetector 13. In this instance, the light emitted from an optical fiber (not shown) is converged toward either the photodetector 12 or the photodetector 13 by the lens 4. When the lens 4 has a larger diameter than the lens 1001, it is possible to increase the tolerance on the position gap of the laser diode 11.

FIG. 8 show the results obtained when the position gap of a laser diode and optical coupling loss are calculated through optical simulations. FIG. 8(A) shows the results obtained when the conventional module system shown in FIG. 9 is used. It is assumed that the lens 171 has the same diameter as the lens 174. FIG. 8(B) shows the results obtained when the module system according to an aspect of the present invention is used. When, for instance, an optical coupling loss of up to −2 dB is permitted, it is evident that the tolerance on the position gap of the laser diode of the module according to an aspect of the present invention is increased to approximately 11 μm although the tolerance on the position gap of the laser diode of a conventional module is as small as approximately 1.1 μm.

Second Embodiment

FIG. 3 is a cross-sectional view of the optical module according to a second embodiment of the present invention.

The present invention shown in FIG. 3 is applied to a dual-wavelength, single-conductor, bi-directional (BIDI) optical module. The optical module according to the second embodiment has the same basic configuration and functionality as the optical module according to the first embodiment. However, the second embodiment includes only one photodetector 30 and uses two operating wavelengths. Therefore, the second embodiment is merely provided with one wavelength-selective filter 26 and one mirror 27.

Third Embodiment

FIG. 4 is a cross-sectional view of the optical module according to a third embodiment of the present invention. This figure illustrates a module configuration where a single-mode fiber 93 is coupled to a CAN package 92 in which the optical system according to the first embodiment is mounted.

Fourth Embodiment

FIGS. 5 and 6 illustrate the optical module according to a fourth embodiment of the present invention. In the fourth embodiment, a CAN package 101 in which a laser diode and photodetectors are included, an optical multiplexer/demultiplexer 102, a lens 103, and a single-mode fiber 104 are mounted in a plane-type package 110. As shown in FIG. 6, the CAN package includes an optical device mounting substrate 112 on which a laser diode 113 and photodetectors 114, 115 are mounted. The CAN package 101 is not limited to the configuration shown in FIG. 6. The CAN package may alternatively include a different LD/PD combination.

Fifth Embodiment

FIG. 7 illustrates the optical module according to a fifth embodiment of the present invention. In the fifth embodiment, an optical device mounting substrate 121, an optical multiplexer/demultiplexer 122, a lens 123, and a single-mode fiber 125 are mounted in a plane-type package 137. The optical device mounting substrate 121 includes a sub-mount 126 on which a laser diode 11 and photodetectors 128, 129 are mounted. The optical multiplexer/demultiplexer 122 includes wavelength-selective filters 131, 132, 133 and mirrors 135, 136. In the present embodiment, the optical device mounting substrate 121 on which the photodetectors are surface-mounted is mounted on the bottom surface of the plane-type package in an upright position, as shown in FIG. 7. Although a triple-wavelength type is shown in FIG. 7, the present embodiment can handle four or more wavelengths with relative ease.

Sixth Embodiment

FIG. 11 is a diagram illustrating a sixth embodiment of the present invention. The present invention shown in FIG. 11 is applied to a triple-wavelength bi-directional optical transceiver module for a PON (Passive Optical Network). In the sixth embodiment, an optical device mounting substrate 1000 is mounted on a CAN stem 194. The optical device mounting substrate 1000 includes a sub-mount 1007 on which a laser diode 191 and photodetectors 192, 193 are mounted. An optical multiplexer/demultiplexer 1002, which includes wavelength-selective filters 196, 197 and mirrors 198, 199, and a package lens 1004 are mounted on a CAN cap 1003. Further, a single-mode fiber 1006 is connected to a fiber holder 1005, which is mounted on the top of the CAN cap. The interior of the CAN cap 1003 is provided with surface irregularities so that the optical multiplexer/demultiplexer can be mounted on the CAN cap 1003. The interior of the CAN cap 1003 also includes a holder portion that permits the mounting of the package lens 1004. The optical multiplexer/demultiplexer 1002 uses a transparent glass substrate 195 as a support substrate. Mounted on one surface of the transparent glass substrate 195 are the first wavelength-selective filter 196 and the second wavelength-selective filter 197, which are positioned adjacent to each other. The first mirror 198 and the second mirror 199 are mounted on the opposing surface, which is parallel to the aforementioned surface. The first wavelength-selective filter 196 exhibits a transmittance of 96% at a wavelength of 1310 nm, and a reflectance of 99% or higher at wavelengths of 1490 nm and 1555 nm. The second wavelength-selective filter 197 exhibits a transmittance of 40% at a wavelength of 1310 nm, a transmittance of 99% or higher at a wavelength of 1490 nm, and a reflectance of 99% or higher at a wavelength of 1555 nm. In the present embodiment, the mirror 198 is identical with the wavelength-selective filter 196, and the mirror 199 is identical with the wavelength-selective filter 197.

The glass substrate is made of transparent glass that has a refractive index of 1.5 and a thickness of 697 μm. The glass substrate is mounted in such a manner that its angle relative to the plane is 30°. The package lens has a focal length of 1.98 mm, an NA of 0.04 at a multiplexer/demultiplexer side light intensity of $1/e^2$, and an NA of 0.09 at a fiber side light intensity of $1/e^2$. The laser diode 191 on the optical integrated substrate is a vertical emitting laser diode that is prepared on an InP substrate. The oscillation wavelength of the laser diode is in a 1.3 μm band. A lens 1008 is monolithically integrated with the vertical emitting LD. The lens 1008 is such that the angle of laser beam emission from the laser diode is 4°.

INDUSTRIAL APPLICABILITY

The present invention relates to an optical module that is used as a multiple-wavelength optical transmission or single-conductor bi-directional optical transmission terminal for transmitting light having multiple wavelengths with one optical fiber. The present invention provides an optical module that can significantly reduce the number of optical parts and the number of mounting steps, for instance, by performing a batch wafer processing operation, permit downsizing, and achieve a high yield without sacrificing low-loss optical characteristics and high reliability. The present invention also provides a method for manufacturing such an optical module.

Figure 1:
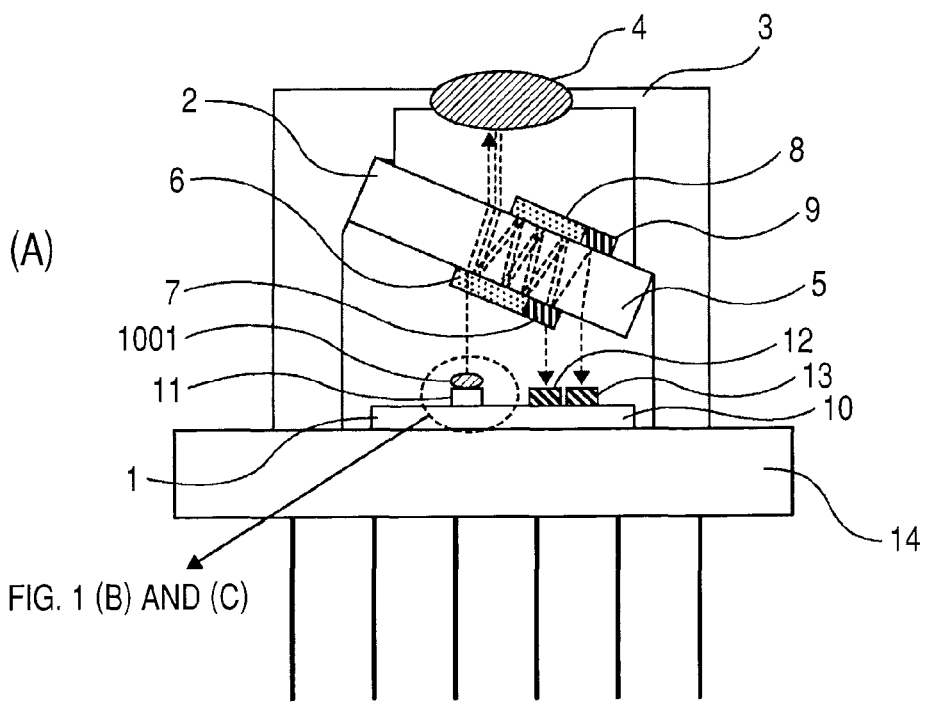
FIG. 1(A) is a cross-sectional view of a triple-wavelength bi-directional optical transceiver module according to a first embodiment of the present invention.
FIG. 1(B) is a cross-sectional view of an integrated lens that is mounted in the optical transceiver module shown in FIG. 1(A).
FIG. 1(C) is a cross-sectional view of an installed lens for the optical transceiver module shown in FIG. 1(A).
Figure 1:
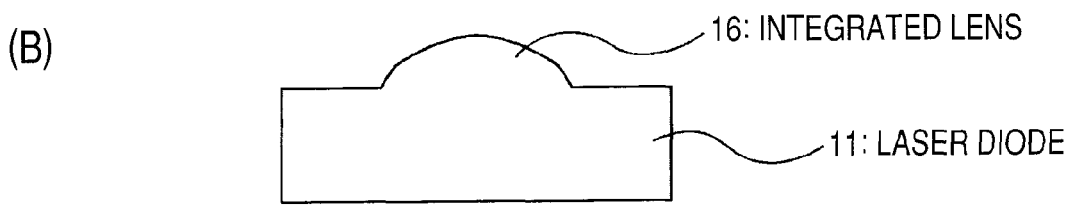
Figure 1:
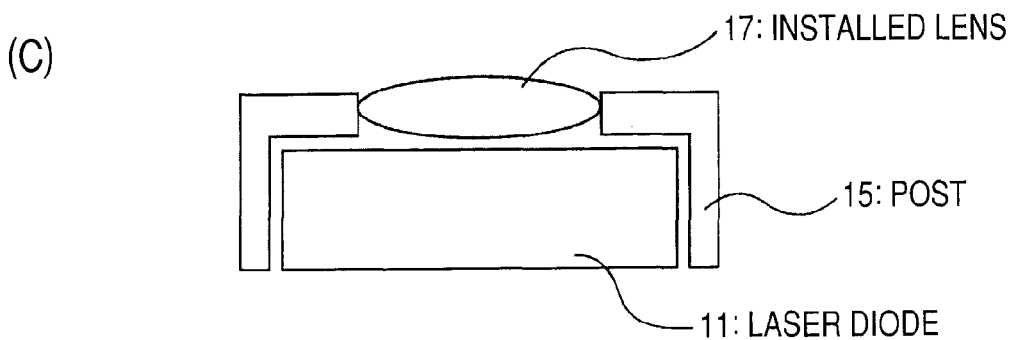
Figure 2:
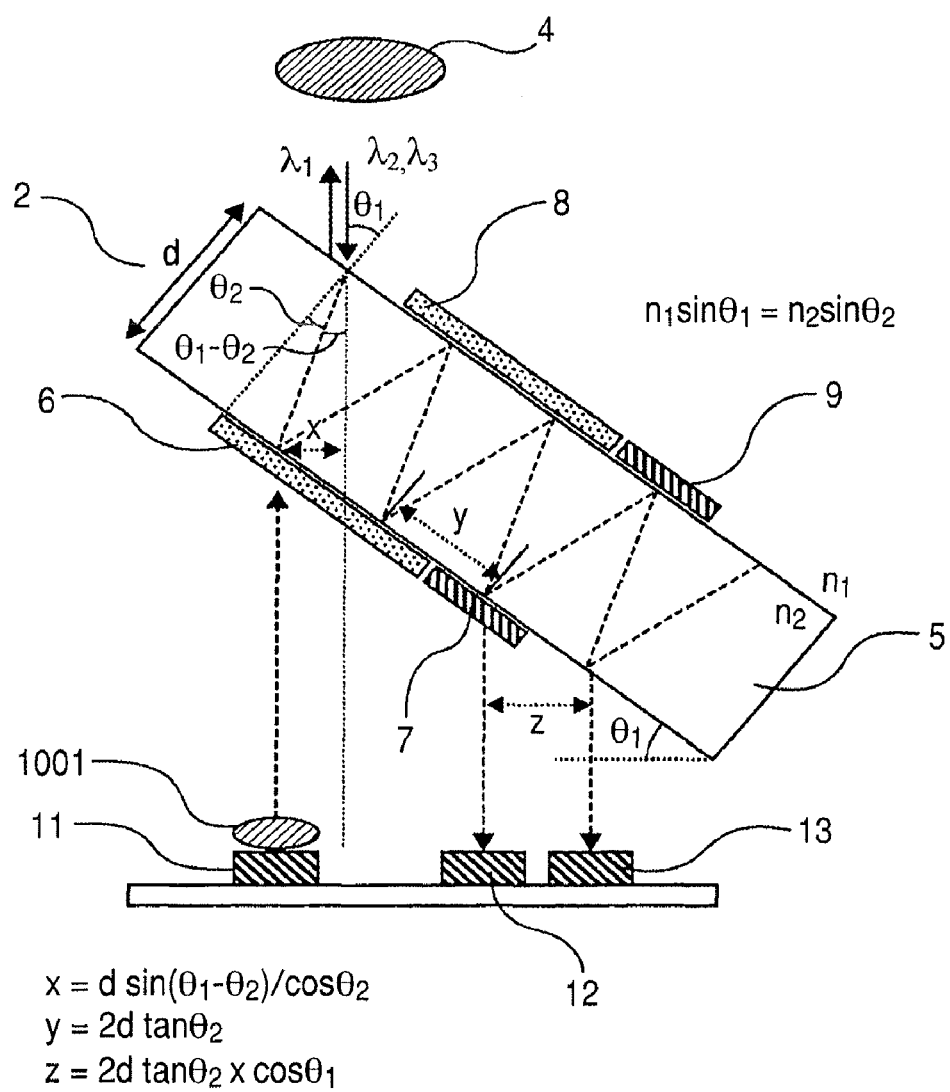
FIG. 2 is a diagram illustrating an operation of the optical transceiver module according to the first embodiment of the present invention.
Figure 3:
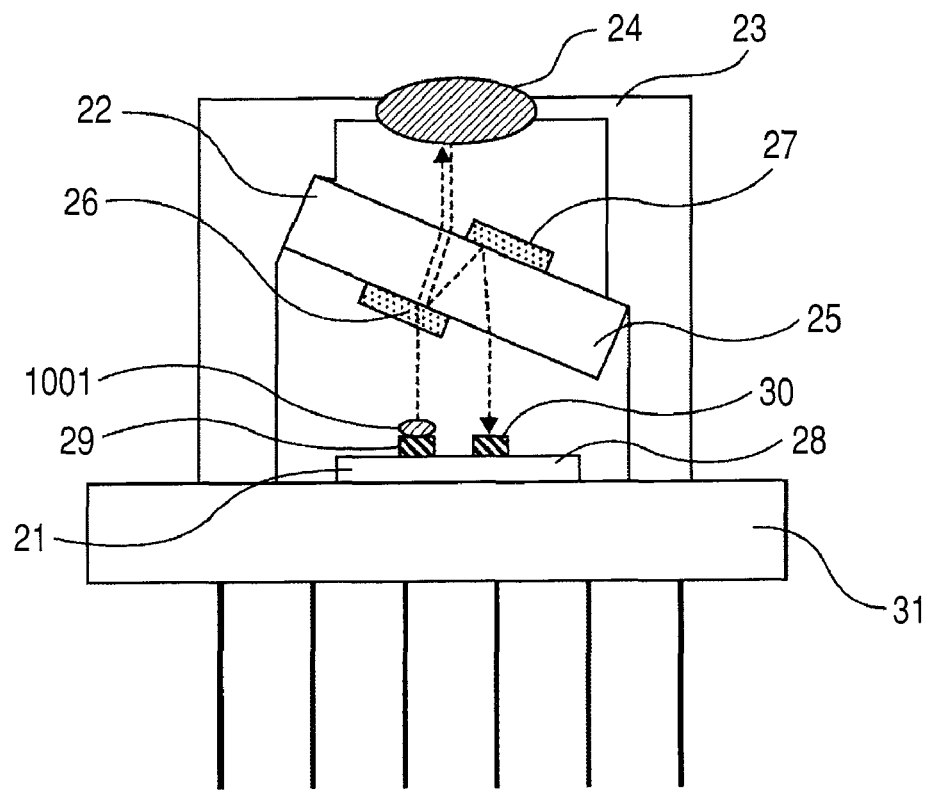
FIG. 3 is a cross-sectional view of a dual-wavelength bi-directional optical transceiver module according to a second embodiment of the present invention.
Figure 4:
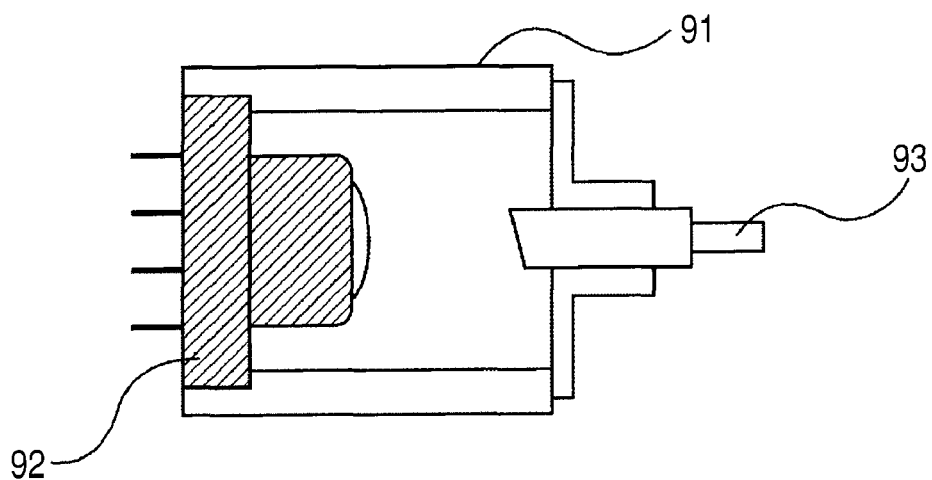
FIG. 4 is a cross-sectional view of the optical transceiver module according to a third embodiment of the present invention. This figure shows a typical structure of a package for coupling a single-mode fiber to the optical transceiver module according to the first or second embodiment.
Figure 5:
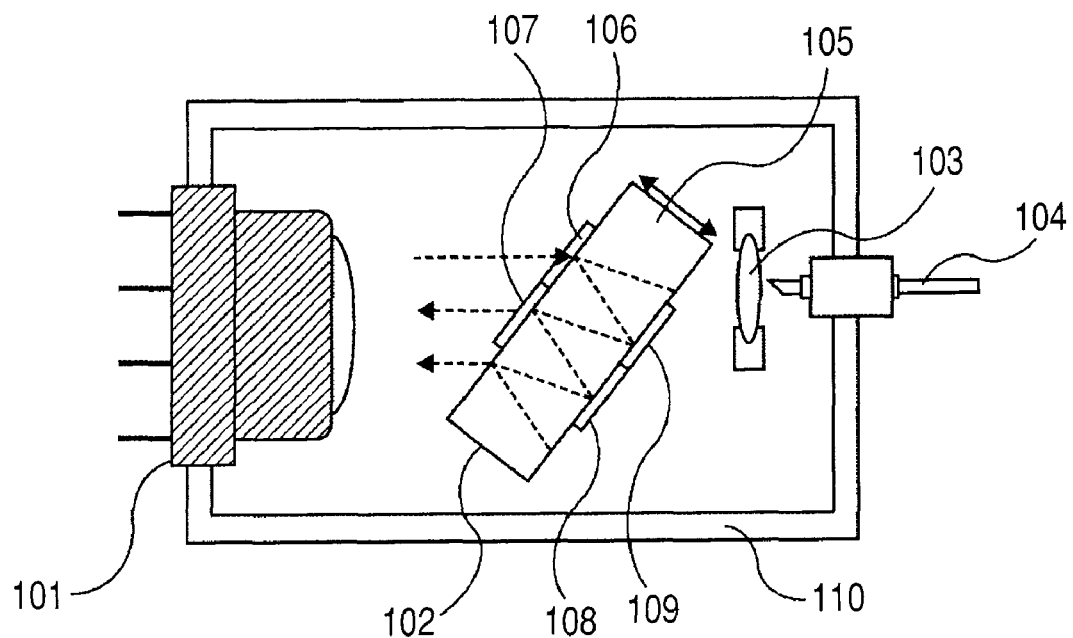
FIG. 5 is a cross-sectional view of the optical transceiver module according to a fourth embodiment of the present invention.
Figure 6:
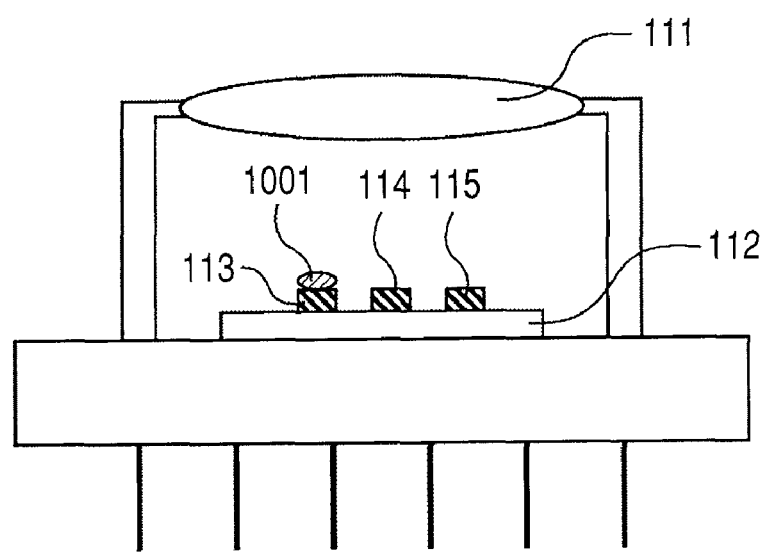
FIG. 6 is a cross-sectional view of an optical device package that forms the optical transceiver module according to the fourth embodiment of the present invention.
Figure 7:
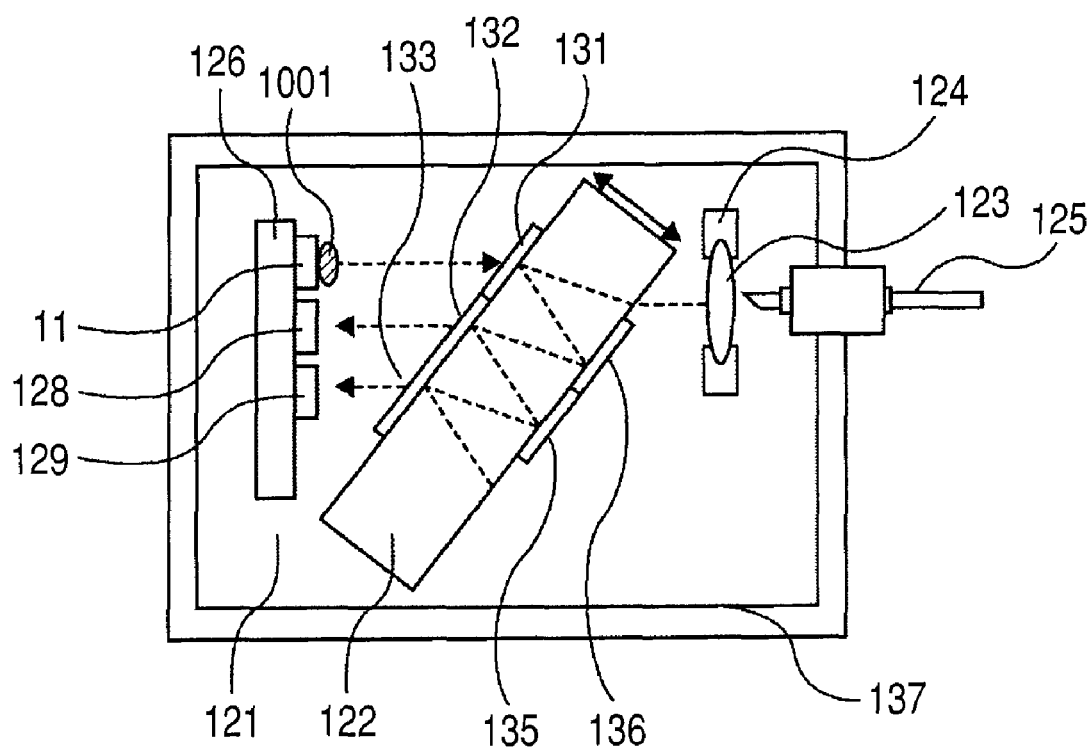
FIG. 7 is a cross-sectional view of the optical transceiver module according to a fifth embodiment of the present invention.
Figure 8:
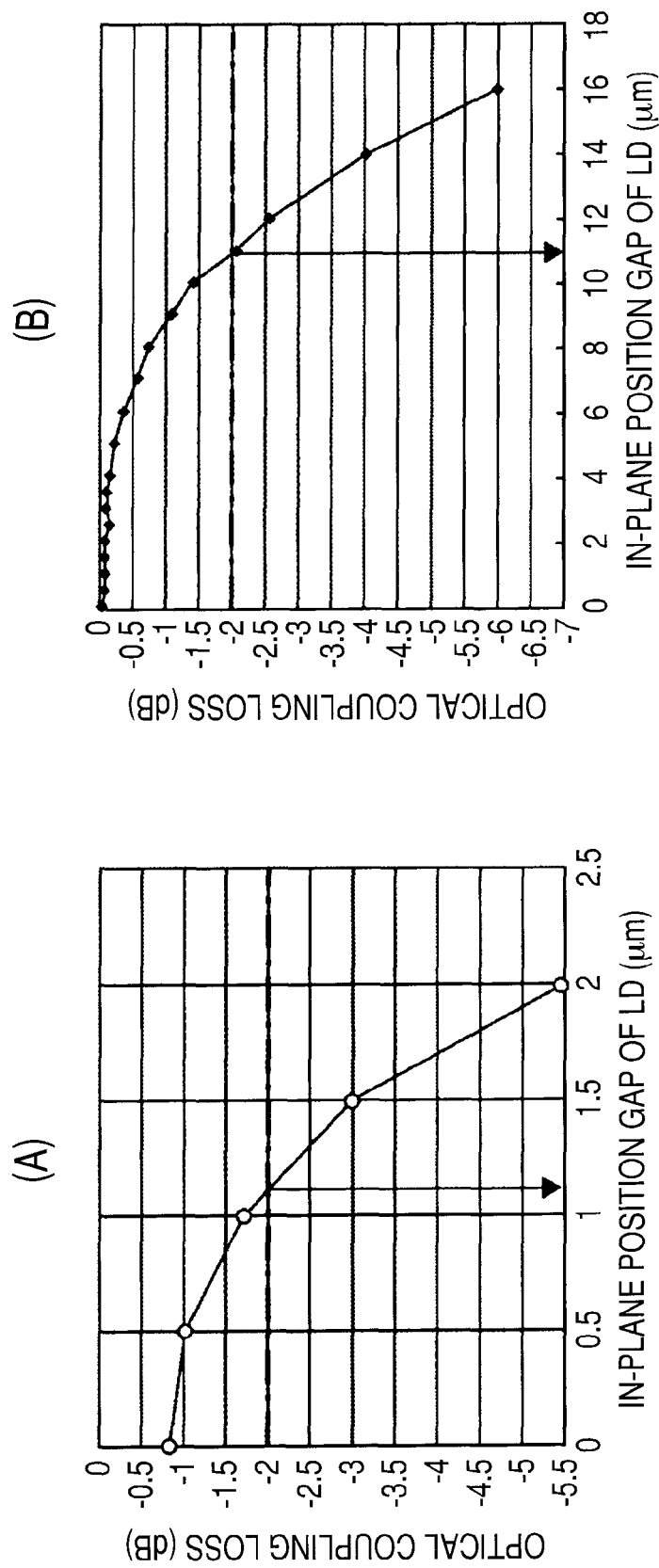
FIG. 8(A) shows the optical coupling loss of a conventional optical transceiver module.
FIG. 8(B) shows the optical coupling loss of the optical transceiver module according to the present invention.
Figure 9:
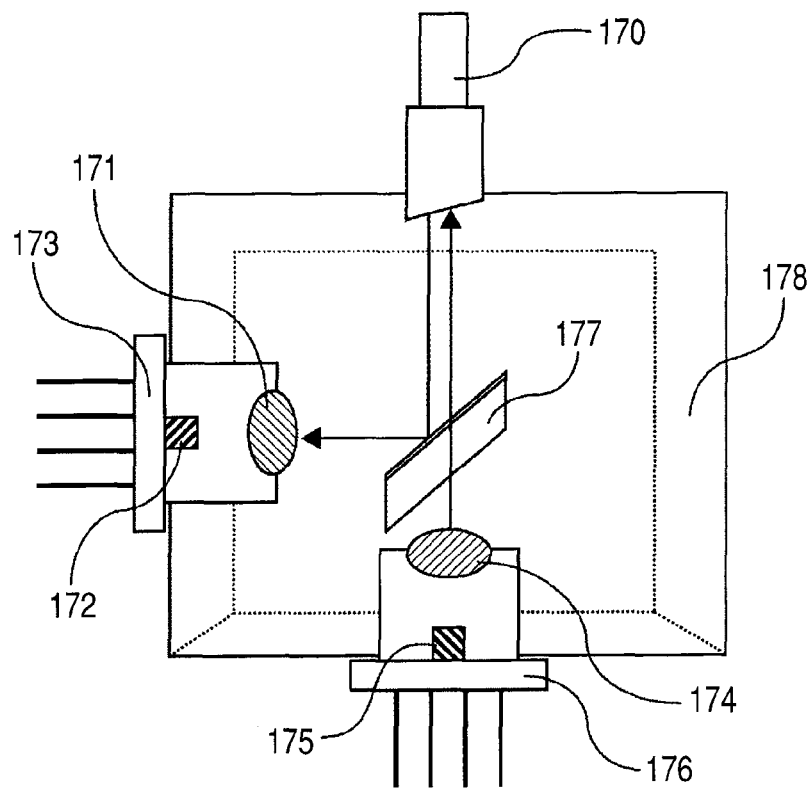
FIG. 9 is a diagram illustrating a basic configuration of a conventional one-package BIDI module.
Figure 10:
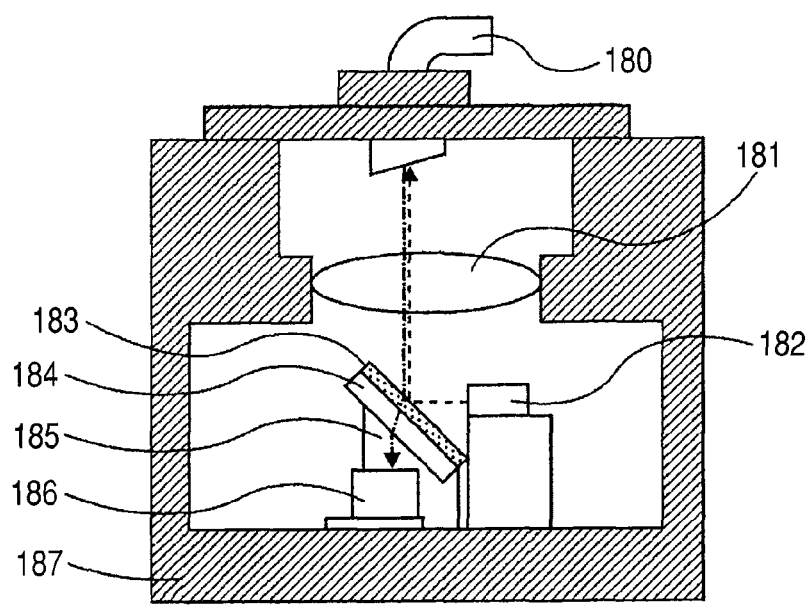
FIG. 10 is a diagram illustrating a basic configuration of a conventional optical multiplexer/demultiplexer.
Figure 11:
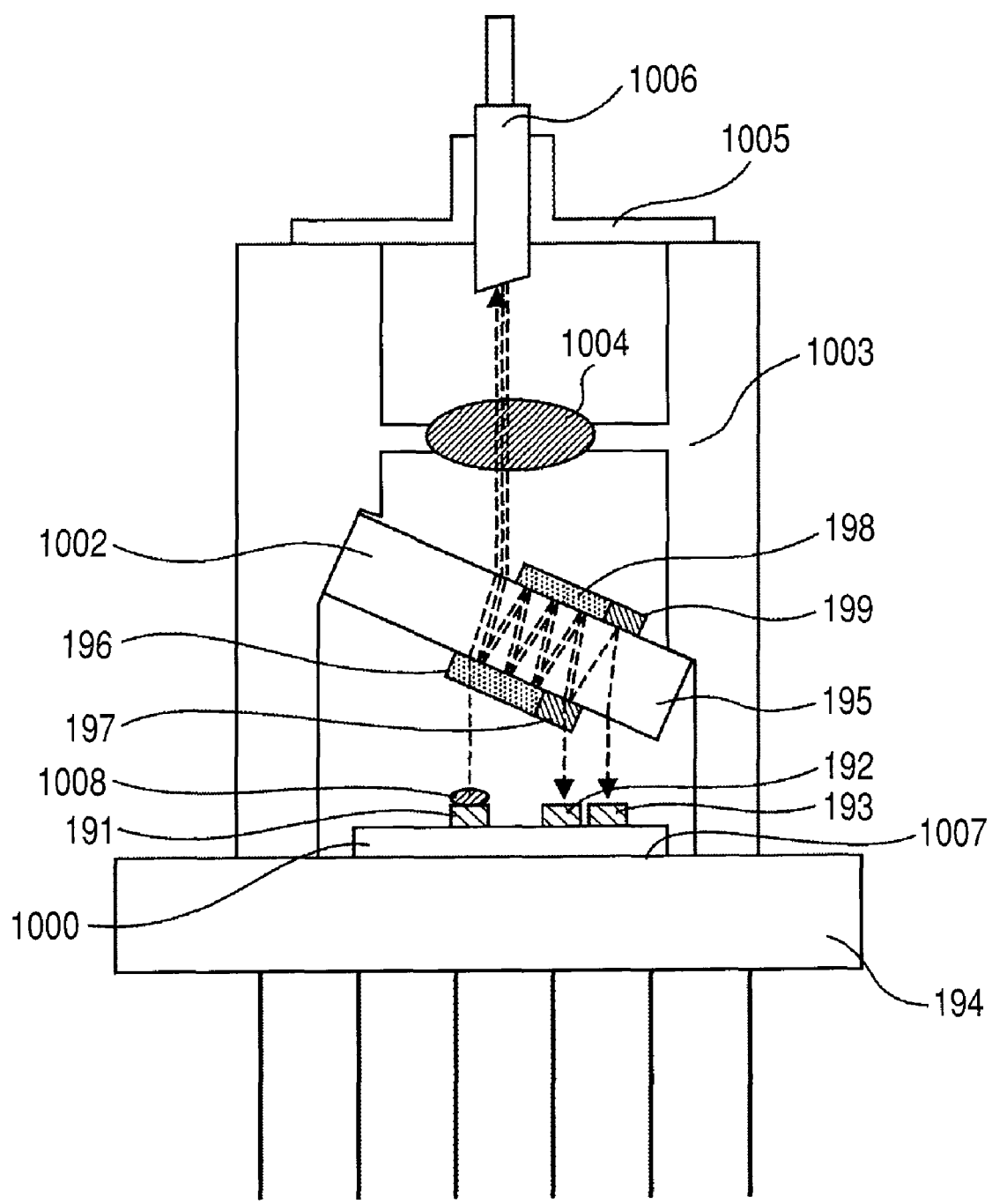
FIG. 11 is a cross-sectional view of a triple-wavelength bi-directional optical transceiver module for a PON (Passive Optical Network) according to a sixth embodiment of the present invention.

EXPLANATION OF REFERENCE NUMERALS AND SYMBOLS 1, 21, 121, 1000 . . . Optical device mounting substrate
2, 22, 102, 122, 1002 . . . Optical multiplexer/demultiplexer
3, 23, 1003 . . . CAN cap
4, 24, 103, 111, 123, 171, 174, 181, 1001, 1004, 1008 . . . Lens
124 . . . Lens holder
5, 25, 105, 184, 195 . . . Glass substrate
185 . . . Filter holder
6, 7, 26, 106, 107, 131, 132, 133, 177, 183, 196, 197 . . . Wavelength-selective filter
8, 9, 27, 108, 109, 135, 136, 198, 199 . . . Mirror
10, 28, 112, 126, 1007 . . . Sub-mount
11, 29, 113, 175, 182, 191 . . . Laser diode
12, 13, 30, 114, 115, 128, 129, 172, 186, 192, 193 . . . Photodetector
14, 31, 194 . . . CAN stem
91, 110, 137, 178 . . . Package
92, 173, 176, 187 . . . CAN package
93, 104, 125, 170, 180, 1006 . . . Single-mode fiber
101, 141, 142 . . . Optical receiver CAN module
1005 . . . Fiber holder

The invention claimed is:

1. An optical transceiver module having one laser diode and one or more photodetectors that use different operating wavelengths and are optically connected to the optical axis of an externally installed optical fiber, the optical transceiver module comprising:
an optical device mounting substrate on which the laser diode and the photodetectors are mounted in the same direction;
a first lens which is positioned near the laser diode or monolithically integrated with the laser diode;
an optical multiplexer/demultiplexer which includes at least one type of a wavelength-selective filter, and a mirror that opposes the wavelength-selective filter and is positioned at a predetermined distance therefrom;
a package which houses the optical device mounting substrate and the optical multiplexer/demultiplexer by fastening the optical device mounting substrate and the optical multiplexer/demultiplexer to desired places; and
a second lens which converges light coming out of the optical multiplexer/demultiplexer toward the optical fiber;
wherein the second lens has a larger diameter than the first lens;
wherein the optical multiplexer/demultiplexer is positioned at a predetermined angle from the optical axis of the optical fiber and fastened to the package;
wherein light emitted from the optical fiber is converged toward one of the photodetectors by the second lens;
wherein the light emitted from the optical fiber or the laser diode is incident on a surface of the wavelength-selective filter at a non-perpendicular angle, and subjected to multiple reflection between the wavelength-selective filter and the mirror in such a manner that light having one wavelength and light having another wavelength are separated from each other or superposed one over the other for multiplexing or demultiplexing purposes; and
wherein the laser diode is positioned closer to the second lens than to a focal position at which the light emitted from the optical fiber is imaged by the second lens.

2. The optical transceiver module according to claim 1, wherein the optical multiplexer/demultiplexer includes a substrate that has a pair of parallel surfaces and is made of a material transparent to operating wavelengths; and wherein one of the pair of parallel surfaces is provided with at least one type of the wavelength-selective filter, and the remaining parallel surface is provided with the mirror.

3. The optical transceiver module according to claim 1, wherein the mirror included in the optical multiplexer/demultiplexer has such transmission/reflection characteristics as to transmit light within a transmission band of the wavelength-selective filter when the light emitted from the optical fiber is reflected from the wavelength-selective filter and re-reflected from the mirror.

4. The optical transceiver module according to claim 3, wherein the mirror is the same wavelength-selective filter as a wavelength-selective filter that is positioned in an optical path of the optical multiplexer/demultiplexer and before the mirror.

5. The optical transceiver module according to claim 1, wherein the wavelength-selective filter is formed by a dielectric multilayer.

6. The optical transceiver module according to claim 1, wherein the wavelength-selective filter is formed by a diffraction grating.

7. The optical transceiver module according to claim 1, wherein a member of the substrate on which the wavelength-selective filter is mounted is amorphous glass, sapphire crystal, crystal quartz, or silicon.

8. The optical transceiver module according to claim 1, wherein the package is a metal CAN cap; and wherein the inner wall of the metal CAN cap is provided with such surface irregularities that the substrate on which the wavelength-selective filter is mounted is fixed at a desired angle.

9. The optical transceiver module according to claim 1, further comprising a dual-wavelength bi-directional optical transceiving function that couples light having a first wavelength, which is emitted from the laser diode, to the optical fiber for transmission purposes, and directs light having a second wavelength, which is emitted from the optical fiber, to the photodetectors for reception purposes.

10. The optical transceiver module according to claim 1, wherein the laser diode emits light perpendicularly to the optical device mounting substrate.

11. An optical transceiver module having one laser diode and two or more photodetectors that use different operating wavelengths and are optically connected to the optical axis of an externally installed optical fiber, the optical transceiver module comprising:

- an optical device mounting substrate on which the laser diode and the photodetectors are mounted in the same direction;
- a first lens which is positioned near the laser diode or monolithically integrated with the laser diode;
- an optical multiplexer/demultiplexer which includes a wavelength-selective filter array that is formed by at least two types of wavelength-selective filters having surfaces arranged in the same plane, and a mirror or a mirror array that opposes the wavelength-selective filter array and is positioned at a predetermined distance therefrom;
- a package which houses the optical device mounting substrate and the optical multiplexer/demultiplexer by fastening the optical device mounting substrate and the optical multiplexer/demultiplexer to desired places; and
- a second lens which converges light coming out of the optical multiplexer/demultiplexer toward the optical fiber;
- wherein the second lens has a larger diameter than the first lens;
- wherein the optical multiplexer/demultiplexer is positioned at a predetermined angle from the optical axis of the optical fiber and fastened to the package;
- wherein light emitted from the optical fiber is converged toward one of the photodetectors by the second lens;
- wherein the light emitted from the optical fiber or the laser diode is incident on a surface of the wavelength-selective filter array at a non-perpendicular angle, and subjected to multiple reflection between the wavelength-selective filter array and the mirror or the mirror array in such a manner that light having one wavelength and light having another wavelength are separated from each other or superposed one over the other for multiplexing or demultiplexing purposes; and
- wherein the laser diode is positioned closer to the second lens than to a focal position at which the light emitted from the optical fiber is imaged by the second lens.

12. The optical transceiver module according to claim 11, wherein the optical multiplexer/demultiplexer includes a housing that has a pair of parallel surfaces and is made of a material transparent to operating wavelengths; and wherein one of the pair of parallel surfaces is provided with at least two types of filters included in the wavelength-selective filter array, and the remaining parallel surface is provided with the mirror or the mirror array.

13. The optical transceiver module according to claim 11, wherein the mirror of the optical multiplexer/demultiplexer has such transmission/reflection characteristics as to transmit light within a transmission band of the wavelength-selective filter when the light emitted from the optical fiber is reflected from the wavelength-selective filter array and re-reflected from the mirror.

14. The optical transceiver module according to claim 13, wherein the mirror is the same wavelength-selective filter as a wavelength-selective filter included in the wavelength-selective filter array that is positioned in an optical path of the optical multiplexer/demultiplexer and before the mirror.

15. The optical transceiver module according to claim 11, wherein the laser diode emits light perpendicularly to the optical device mounting substrate.

16. The optical transceiver module according to claim 11, wherein the laser diode and at least two of the photodetectors, which are mounted on the optical device mounting substrate in the same direction, are arranged in increasing or decreasing order of the operating wavelengths thereof.

17. The optical transceiver module according to claim 11, wherein individual filters constituting the filter array of the optical multiplexer/demultiplexer are so-called edge filters that transmit either light having a wavelength greater than or light having a wavelength less than a desired separation wavelength within the operating wavelength ranges of the laser diode and the photodetectors, and reflect the other light; and wherein the edge filters constituting the filter array are arranged in increasing or decreasing order of the separation wavelength.

18. The optical transceiver module according to claim 11, further comprising a triple-wavelength bi-directional optical transceiving function that couples light having a first wavelength, which is emitted from the laser diode, to the optical fiber for transmission purposes, subjects wavelength-multiplexed light emitted from the optical fiber to wavelength separation to obtain light having a second wavelength and light having a third wavelength, and directs the light having the second wavelength and the light having the third wavelength to the respective associated photodetectors for reception purposes.

* * * * *